(12) United States Patent
Bangsaruntip et al.

(10) Patent No.: US 8,441,043 B2
(45) Date of Patent: May 14, 2013

(54) MASKLESS PROCESS FOR SUSPENDING AND THINNING NANOWIRES

(75) Inventors: Sarunya Bangsaruntip, Mount Kisco, NY (US); Guy Cohen, Mohegan Lake, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 183 days.

(21) Appl. No.: 13/006,833

(22) Filed: Jan. 14, 2011

(65) Prior Publication Data
US 2011/0108804 A1 May 12, 2011

Related U.S. Application Data

(62) Division of application No. 12/365,623, filed on Feb. 4, 2009, now Pat. No. 7,884,004.

(51) Int. Cl.
*H01L 21/00* (2006.01)

(52) U.S. Cl.
USPC ........................................... 257/213; 257/24

(58) Field of Classification Search ................... 257/213, 257/24; 977/720
See application file for complete search history.

(56) References Cited

U.S. PATENT DOCUMENTS

| | | | |
|---|---|---|---|
| 6,897,098 B2 | 5/2005 | Hareland et al. | |
| 7,051,945 B2 | 5/2006 | Empedocles et al. | |
| 7,064,372 B2 | 6/2006 | Duan et al. | |
| 7,067,867 B2 | 6/2006 | Duan et al. | |
| 7,083,104 B1 | 8/2006 | Empedocles et al. | |
| 7,102,605 B2 | 9/2006 | Stumbo et al. | |
| 7,105,428 B2 | 9/2006 | Pan et al. | |
| 7,116,546 B2 | 10/2006 | Chow et al. | |

(Continued)

FOREIGN PATENT DOCUMENTS

| | | |
|---|---|---|
| JP | 2005239481 | 9/2005 |
| JP | 2005314164 | 11/2005 |
| JP | 2008072107 | 3/2008 |

OTHER PUBLICATIONS

Oh et al., "Analytic Description of Short-Channel Effects in Fully-Depleted Double-Gate and Cylindrical, Surrounding-Gate MOSFETs," Electron Dev. Lett., vol. 21, No. 9, p. 445-447 (2000).

(Continued)

*Primary Examiner* — Laura Menz
(74) *Attorney, Agent, or Firm* — Vazken Alexanian; Michael J. Chang, LLC

(57) ABSTRACT

Semiconductor-based electronic devices and techniques for fabrication thereof are provided. In one aspect, a device is provided comprising a first pad; a second pad and a plurality of nanowires connecting the first pad and the second pad in a ladder-like configuration formed in a silicon-on-insulator (SOI) layer over a buried oxide (BOX) layer, the nanowires having one or more dimensions defined by a re-distribution of silicon from the nanowires to the pads. The device can comprise a field-effect transistor (FET) having a gate surrounding the nanowires wherein portions of the nanowires surrounded by the gate form channels of the FET, the first pad and portions of the nanowires extending out from the gate adjacent to the first pad form a source region of the FET and the second pad and portions of the nanowires extending out from the gate adjacent to the second pad form a drain region of the FET.

8 Claims, 16 Drawing Sheets

U.S. PATENT DOCUMENTS

| | | | |
|---|---|---|---|
| 7,129,554 B2 | 10/2006 | Lieber et al. | |
| 7,135,728 B2 | 11/2006 | Duan et al. | |
| 7,145,246 B2 | 12/2006 | Hareland et al. | |
| 7,151,006 B2 | 12/2006 | Zentai et al. | |
| 7,211,464 B2 | 5/2007 | Lieber et | |
| 7,233,041 B2 | 6/2007 | Duan et al. | |
| 7,254,151 B2 | 8/2007 | Lieber et al. | |
| 7,262,501 B2 | 8/2007 | Duan et al. | |
| 7,273,732 B2 | 9/2007 | Pan et al. | |
| 7,295,419 B2 | 11/2007 | Chow et al. | |
| 7,534,675 B2 * | 5/2009 | Bangsaruntip et al. | 438/197 |
| 7,557,367 B2 | 7/2009 | Rogers et al. | |
| 7,622,367 B1 | 11/2009 | Nuzzo et al. | |
| 7,700,419 B2 | 4/2010 | Anwar et al. | |
| 7,795,677 B2 * | 9/2010 | Bangsaruntip et al. | 257/347 |
| 7,816,275 B1 * | 10/2010 | Fuller et al. | 438/745 |
| 7,884,004 B2 * | 2/2011 | Bangsaruntip et al. | 438/586 |
| 7,892,945 B2 * | 2/2011 | Bedell et al. | 438/445 |
| 7,893,492 B2 * | 2/2011 | Bedell et al. | 257/346 |
| 7,923,314 B2 * | 4/2011 | Tezuka et al. | 438/157 |
| 8,008,146 B2 * | 8/2011 | Bangsaruntip et al. | 438/211 |
| 8,084,308 B2 * | 12/2011 | Chang et al. | 438/151 |
| 8,097,515 B2 * | 1/2012 | Bangsaruntip et al. | 438/282 |
| 8,119,528 B2 * | 2/2012 | Schrott et al. | 438/689 |
| 8,129,247 B2 * | 3/2012 | Bangsaruntip et al. | 438/300 |
| 8,143,113 B2 * | 3/2012 | Bangsaruntip et al. | 438/149 |
| 8,173,993 B2 * | 5/2012 | Bangsaruntip et al. | 257/38 |
| 8,216,902 B2 * | 7/2012 | Chang et al. | 438/275 |
| 8,241,971 B2 * | 8/2012 | Bangsaruntip et al. | 438/151 |
| 8,263,477 B2 * | 9/2012 | Bangsaruntip et al. | 438/458 |
| 8,298,881 B2 * | 10/2012 | Sleight et al. | 438/151 |
| 8,309,991 B2 * | 11/2012 | Bangsaruntip et al. | 257/213 |
| 8,313,990 B2 * | 11/2012 | Bangsaruntip et al. | 438/151 |
| 8,324,030 B2 * | 12/2012 | Bangsaruntip et al. | 438/151 |
| 8,324,940 B2 * | 12/2012 | Bangsaruntip et al. | 326/121 |
| 2005/0079659 A1 | 4/2005 | Duan et al. | |
| 2008/0157235 A1 | 7/2008 | Rogers et al. | |
| 2010/0193770 A1 * | 8/2010 | Bangsaruntip et al. | 257/24 |
| 2011/0108804 A1 * | 5/2011 | Bangsaruntip et al. | 257/24 |
| 2012/0007051 A1 * | 1/2012 | Bangsaruntip et al. | 257/24 |

OTHER PUBLICATIONS

Liu et al., "Self-Limiting Oxidation for Fabricating Sub-5 nm Silicon Nanowires," Appl. Phys. Lett., 64(11), pp. 1383-1385 (1994).

Ashcroft and Mermin, Solid State Physics, chapter 4 (1976).

Lee et al., "Thermal Annealing in Hydrogen for 3-D Profile Transformation on Silicon-on-Insulator and Sidewall Roughness Reduction," Journal of Microelectromechanical Systems, vol. 15, No. 2 (2006).

Dornel et al., "Hydrogen Annealing of Arrays of Planar and Vertically Stacked Si Nanowires," Applied Physics Letters 91 (2007).

Shimizu et al., "Mechanism and Control Technology of Trench Corner Rounding by Hydrogen Annealing for Highly Reliable trench MOSFET," Proceedings of the 18th International Symposium on Power Semiconductor Devices & IC's (2006).

Yang et al., "5nm-Gate Nanowire FinFET," Symposium on VLSI Technology Digest of Technical Papers (2004).

* cited by examiner

CLEARED GATE MATERIAL

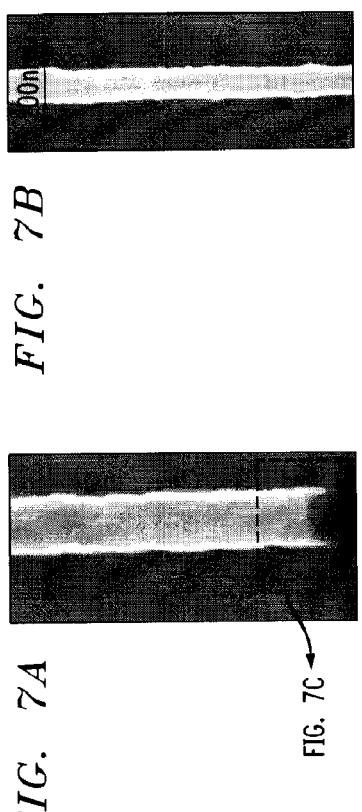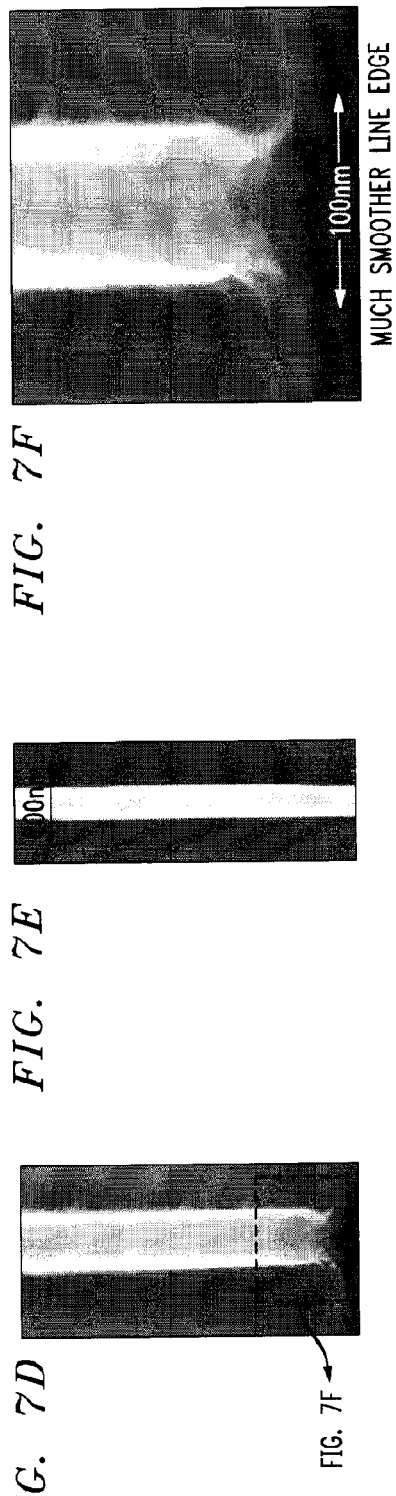
FIG. 7A  FIG. 7B  FIG. 7C
FIG. 7D  FIG. 7E  FIG. 7F

| CD | = 40.4 ± 1.1 nm |
| LWR | = 5.8 ± 2.9 nm |
| LWR' | = 5.7 ± 2.9 nm |
| LER | = 2.8 ± 0.6 nm |
| LER' | = 2.6 ± 0.6 nm |

| CD | = 23.7 ± 0.3 nm |
| LWR | = 3.8 ± 0.5 nm |
| LWR' | = 3.6 ± 0.5 nm |
| LER | = 3.1 ± 0.3 nm |
| LER' | = 3.0 ± 0.4 nm |

CD = 37.9 ± 0.9 nm
LWR = 2.5 ± 0.5 nm
LWR' = 2.2 ± 0.6 nm
LER = 1.2 ± 0.2 nm
LER' = 0.9 ± 0.3 nm

CD = 23.3 ± 0.7 nm
LWR = 2.6 ± 0.7 nm
LWR' = 2.2 ± 0.8 nm
LER = 1.7 ± 0.5 nm
LER' = 1.3 ± 0.6 nm

1400

1500

MASKLESS PROCESS FOR SUSPENDING AND THINNING NANOWIRES

CROSS-REFERENCE TO RELATED APPLICATIONS

This application is a divisional of U.S. application Ser. No. 12/365,623 filed on Feb. 4, 2009, now U.S. Pat. No. 7,884,004, the contents of which are incorporated by reference herein.

FIELD OF THE INVENTION

The present invention relates to semiconductor-based electronic devices, and more particularly, to field-effect transistor (FET) devices having nanowire channels and techniques for fabrication thereof.

BACKGROUND OF THE INVENTION

Gate length scaling of gate-all-around (GAA) field-effect transistors (FETs) with nanowire channels can be achieved provided that the nanowire channel diameter can be reduced. For example, scaling of a GAA metal-oxide semiconductor field-effect transistor (MOSFET) to sub-20 nanometer (nm) gate length requires nanowire channels with a diameter of less than 10 nm. See, for example, Oh et al., "Analytic Description of Short-Channel Effects in Fully-Depleted Double-Gate and Cylindrical, Surrounding-Gate MOSFETs," Electron Dev. Lett., vol 21, no. 9, pgs. 445-47 (2000). Fabricating nanowires at this scale with current lithographic capabilities introduces large variations, both in nanowire size and in line edge roughness (LER). The scale of these variations can be a significant fraction of the nanowire size, and can thus lead to perturbations in the channel potential and scattering that degrade the charge transport characteristics. Additionally, variations in the nanowire diameter induce variations in the FET's threshold voltage.

In many instances the size of the nanowires needs to be reduced further to dimensions smaller than current lithographic methods can produce. Thinning of the nanowire body is commonly achieved by thermal oxidation. However, the oxidation rate of nanowires can be substantially slower than planar silicon (Si), with the oxidation rate dropping with smaller diameter nanowires. See, for example, Liu et al., "Self-Limiting Oxidation for Fabricating Sub-5 nm Silicon Nanowires," Appl. Phys. Lett., 64(11), pgs. 1383-1385 (1994). As such, the oxidation time required for thinning of nanowires can undesirably result in the complete oxidation of the planar Si in the source and drain regions. To avoid oxidation of the source and drain regions most methods use an oxidation blocking mask to protect these regions. The blocking mask needs to be aligned and patterned such that it will cover the source and drain regions but leave the nanowires exposed. Stress in the mask can lead to an uneven oxidation at the mask's edge, which leads to non-uniform thinning of the nanowires.

In view of the foregoing, there is a need for techniques that form thin nanowires with good dimensional control and very low LER. The required nanowires dimension may be smaller than can be defined by lithographic techniques, so thinning of the nanowires may be needed. The thinning method needs to reduce the diameter of the nanowires without thinning the planar source and drain regions to which the nanowires are attached. Preferably, the thinning method should be maskless for simplicity and cost reduction, and to avoid uneven thinning that typically occur at the mask edges.

SUMMARY OF THE INVENTION

The present invention provides semiconductor-based electronic devices and techniques for fabrication thereof. In one aspect of the invention, a device is provided comprising a first pad; a second pad and a plurality of nanowires connecting the first pad and the second pad in a ladder-like configuration formed in a silicon-on-insulator (SOI) layer over a buried oxide (BOX) layer, the nanowires having one or more dimensions defined by a re-distribution of silicon from the nanowires to the pads. The device can comprise a field-effect transistor (FET) having a gate surrounding the nanowires wherein portions of the nanowires surrounded by the gate form channels of the FET, the first pad and portions of the nanowires extending out from the gate adjacent to the first pad form a source region of the FET and the second pad and portions of the nanowires extending out from the gate adjacent to the second pad form a drain region of the FET.

In another aspect of the invention, a method of fabricating a device is provided comprising the following steps. A first pad, a second pad and a plurality of nanowires connecting the first pad and the second pad are patterned in a ladder-like configuration in an SOI layer over a BOX layer. The nanowires and pads are contacted with an inert gas at a pressure, temperature and for a duration sufficient to cause silicon to migrate from the nanowires to the pads. The device can comprise a FET having a gate formed surrounding the nanowires wherein portions of the nanowires surrounded by the gate form channels of the FET, the first pad and portions of the nanowires extending out from the gate adjacent to the first pad form a source region of the FET and the second pad and portions of the nanowires extending out from the gate adjacent to the second pad form a drain region of the FET.

A more complete understanding of the present invention, as well as further features and advantages of the present invention, will be obtained by reference to the following detailed description and drawings.

BRIEF DESCRIPTION OF THE DRAWINGS

FIGS. 7A-F are scanning electron micrograph (SEM) images illustrating the effects of hydrogen ($H_2$) annealing on a silicon (Si) bar according to an embodiment of the present invention;

DETAILED DESCRIPTION OF PREFERRED EMBODIMENTS

The present techniques provide a gate-all-around (GAA) nanowire field-effect transistor (FET) as well as methods for fabricating the same. In this discussion, reference will be made to various drawings that illustrate embodiments of the present teachings. Since the drawings of the embodiments of the present teachings are provided for illustrative purposes, the structures contained therein are not drawn to scale.

The present methods are described using silicon (Si) nanowires and Si processing. However, the present techniques can also be practiced with other semiconductor materials such as, for example, germanium (Ge) or III-V semiconductors. When non-Si-containing semiconductors are used, the processing steps of the present teachings are basically the same except that growth temperature and dopant species applied are adapted to the specific semiconductor used. Use of Si-containing semiconductor materials such as Si, silicon germanium (SiGe), Si/SiGe, silicon carbide (SiC) or silicon germanium carbide (SiGeC), for example, are however preferred. It is noted that a portion of the nanowires is used herein as the device channel or body.

Figure 1A:
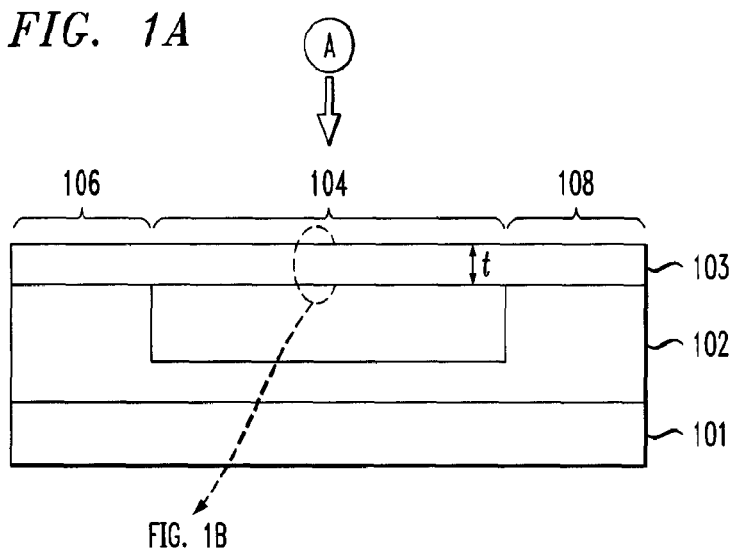
FIGS. 1A-D are diagrams illustrating formation of a starting nanowire-based field-effect transistor (FET) device structure according to an embodiment of the present invention.

The process for fabricating the present GAA FET with nanowire channels will now be described. Specifically, FIGS. 1A-D are diagrams illustrating formation of the starting FET device structure. Referring to FIG. 1A, a cross-sectional diagram, for example through plane A1-A2 (see FIG. 1C, described below), a wafer consisting of a Si substrate 101, a buried oxide (BOX) layer 102 and a silicon-on-insulator (SOI) layer 103, is used as the starting semiconductor substrate. The wafer can be fabricated using methods such as Si implanted oxide (SIMOX) or wafer bonding. These wafer fabrication techniques are known to those of skill in the art and thus are not described further herein. Also, the substitution of other SOI substrates known in the art for the SOI on BOX configuration described herein may be made and would be in the scope of the present teachings.

Nanowires 104 connected to SOI pads 106 and 108 are patterned in SOI layer 103, forming a ladder-like structure (see FIG. 1C, described below). Typically, SOI layer 103 comprises a film having a thickness of from about 20 nanometers (nm) to about 30 nm. This thickness also defines a thickness t dimension of the as-patterned nanowires 104. A width w dimension (see FIG. 1B, described below) of the as-patterned nanowires can be in the range of from about 10 nm to about 30 nm. The patterning of the nanowires 104 and SOI pads 106 and 108 is done by conventional lithography (e.g., optical or e-beam) followed by reactive ion etching (RIE). These patterning techniques are known to those of skill in the art and thus are not described further herein.

As highlighted above, the scale of imperfections introduced by the typical processing techniques used to define the nanowires can be a substantial fraction of their size. Photoresist line edge roughness (LER), line width roughness (LWR) and RIE damage can all lead to structural variations in the nanowires sidewalls, as illustrated by the LER 110 of FIG. 1D, described below.

The nanowires 104 can be suspended (released from the BOX layer) by etching the BOX layer 102 and recessing the BOX layer 102 under the nanowires 104. The nanowires 104 form a suspended bridge between the SOI pads 106 and 108. Recessing of the BOX layer 102 can be achieved with a diluted hydrofluoric (DHF) etch. The DHF etch is isotropic. The lateral component of the etching undercuts the BOX layer under the narrow nanowires, however the large SOI pads are not released and remain attached to the BOX layer 102. Alternatively, instead of using a DHF etch, the suspension of the nanowires may be obtained during the below-described annealing process configured to re-shape the nanowire which can also cause separation of the nanowire from the BOX layer.

While SOI substrates provide an easy path to define nanowires and later suspend the nanowires by etching the BOX layer, it is possible to obtain a suspended nanowires structure with other substrates. For example, a SiGe/Si stack epitaxially grown on bulk Si wafers can also be patterned to form the nanowires. The SiGe layer can be used as a sacrificial layer (analogous to the BOX layer) which is undercut to suspend the nanowires.

Figure 1B:
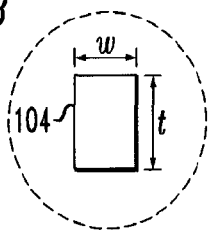

FIG. 1B is a diagram illustrating a cross-sectional cut through one of the as-patterned nanowires 104. As shown, the as-patterned nanowires have a rectangular cross-section which will need to be re-shaped to achieve desired final device dimensions.

Figure 1C:
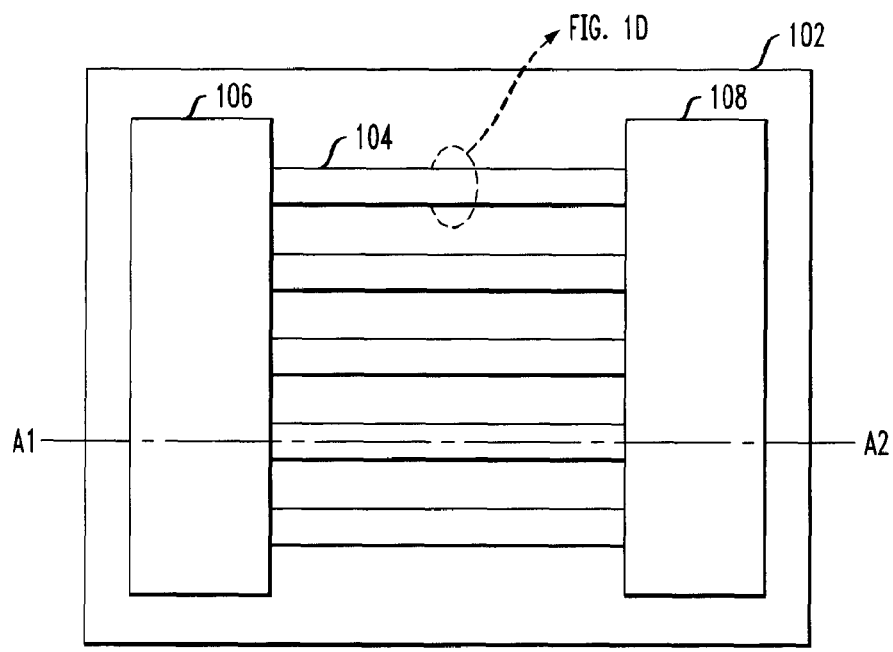
Figure 1D:
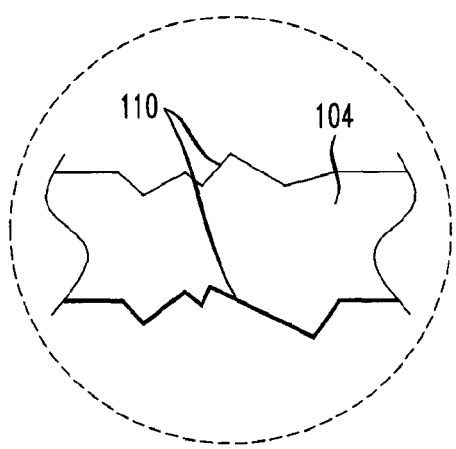

FIG. 1C is a diagram illustrating a top-down view (from vantage point A, see FIG. 1A) of the as-patterned nanowires and pads. The nanowires and pads form a "ladder-like" structure. An enlarged view of one of the as patterned nanowires is shown in FIG. 1D. Namely, as shown in FIG. 1D, the patterning process used to form nanowires 104 (and pads 106 and 108) leads to LER 110.

FIGS. 2A-E are diagrams illustrating use of an annealing process to thin and re-shape the nanowires. During the annealing process, the SOI wafer is contacted with an inert gas at a temperature, pressure and for a duration sufficient to cause Si to migrate from the nanowires to the pads. The term "inert gas" refers to a gas that does not react with Si. Exemplary inert gases include hydrogen (H₂), xenon (Xe), helium (He) and potentially others. A content of oxygen (O₂) or water (H₂O) in the inert gas is typically very small and can be further reduced (to part per billion levels) by the use of gas purifiers. While the presence of O₂ or H₂O is typically viewed as undesirable, it actually provides a way for controlling the rate of the Si re-distribution. The rate is controlled by a total pressure of the inert gas in contact with the wafer. Additionally, gas phase reactions between the inert gas and $O_2$ can affect the rate of the Si re-distribution. The following description uses $H_2$ as the exemplary inert gas, with the understanding that other inert gases can be similarly employed.

Figure 2A:
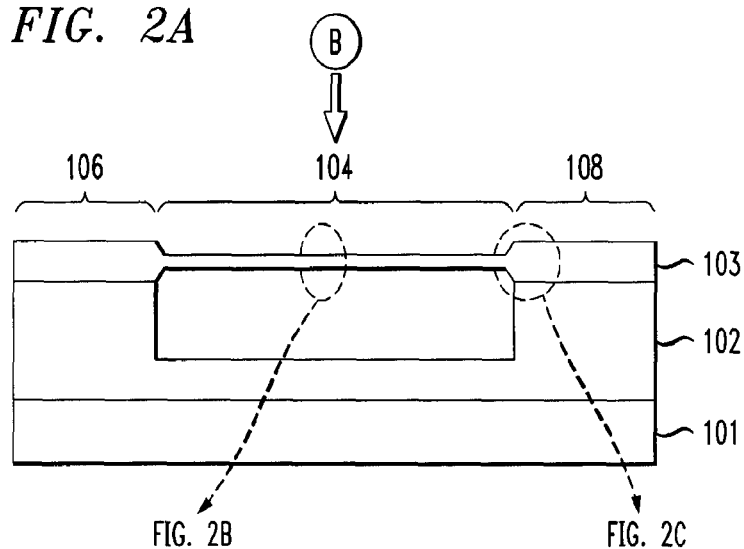
FIGS. 2A-E are diagrams illustrating use of an annealing process to thin and re-shape the nanowires according to an embodiment of the present invention.
Figure 2B:
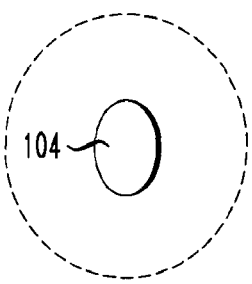

Referring to FIG. 2A, a cross-sectional diagram, for example through plane B1-B2 (see, FIG. 2D, described below), the wafer is annealed in a $H_2$ gas. Shortly before $H_2$ annealing any native oxide is etched off sidewalls 114 of the nanowires 104 (see FIG. 2E, described below) as well as the pads 106 and 108. The annealing in $H_2$ has several goals. First, the $H_2$ anneal aids in smoothing the nanowires sidewalls. Second, the $H_2$ anneal realigns the sidewalls of the nanowires 104 and the SOI pads 106 and 108 to the crystal planes. Crystal planes are a mathematical/physical concept used to explain diffraction. Crystal planes are described, for example, in Ashcroft and Mermin, Solid State Physics, chapter 4 (1976), the contents of which are incorporated by reference herein. Third, the $H_2$ anneal re-shapes the nanowire cross-section from a rectangular cross-section (as shown in FIG. 1B, described above) to a more cylindrical (yet faceted) cross-section (as shown in FIG. 2B, described below). Fourth, the $H_2$ anneal thins the nanowire body (by re-distributing Si from the nanowire body to the SOI pads, i.e., Si migrates during the $H_2$ anneal from the nanowires to the pads (see, FIG. 2C, described below)). As a result, post $H_2$ anneal, the nanowires will be thinner than the pads (compare, for example, FIG. 1A with FIG. 2A).

According to an exemplary embodiment, the inert gas anneal is performed with a gas pressure of from about 30 torr to about 1000 torr, at a temperature of from about 600 degrees Celsius (° C.) to about 1100° C. and for a duration of from about one minute to about 120 minutes. In general, the rate of Si re-distribution increases with temperature and decrease with an increase in pressure. As highlighted above, instead of using a DHF etch, the suspension of the nanowires may also be obtained during the anneal since the re-shaping of the nanowire cross-section and migration of Si to the SOI pads leads to release/separation of the nanowire from the BOX layer.

The re-distribution/migration of Si achieves a selective mask-less process to thin down nanowires. By having connected pads, Si from the nanowires' high curvature surfaces migrate to the flat SOI pads, which act as Si sinks. As highlighted above, size reduction of the nanowires is often achieved by thermal oxidation. However, the oxidation rate of nanowires in this diameter range is substantially slower than planar Si, requiring a block mask to protect the source and drain pads. This mask leads to an uneven oxidation at the mask edge (e.g., due to stress). The present process is therefore simpler and circumvents all issues introduced by masking.

Figure 2C:
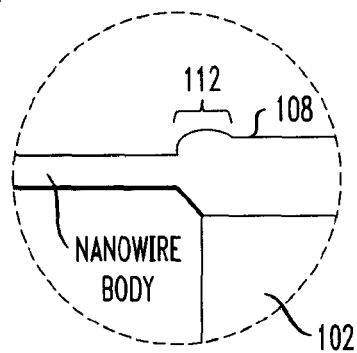

FIG. 2B is a diagram illustrating a cross-sectional cut through one of the reshaped/thinned nanowires 104. As shown in FIG. 2B, the nanowires 104 now have a more cylindrical (yet faceted) cross-sectional shape. FIG. 2C is a diagram illustrating an enlarged view of a junction between one of the nanowires 104 and a pad 108. As shown in FIG. 2C, the $H_2$ anneal causes Si to migrate from the nanowires 104 (also referred to herein as the "nanowire body" so as to distinguish the nanowires from the pads) to the SOI pads 106 and 108, effectively re-distributing Si from the nanowires 104 to the pads 106 and 108. This migration results in a "pile up" 112 of Si on the pads, i.e., at the juncture of the nanowires and the pads. The Si "pile-up" in FIG. 2C can be minimized, or eliminated by optimizing the annealing conditions.

Figure 2D:
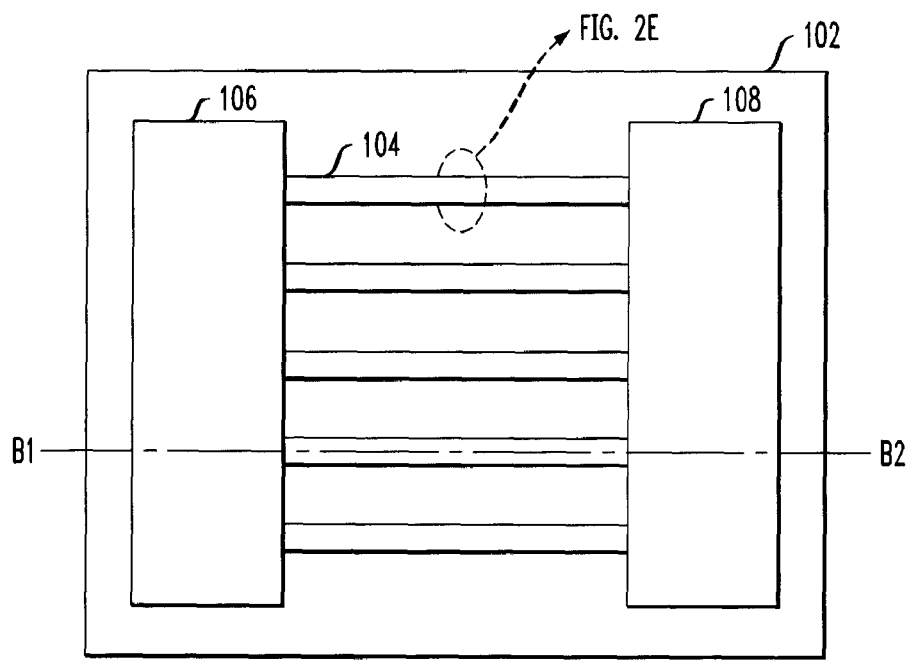
Figure 2E:
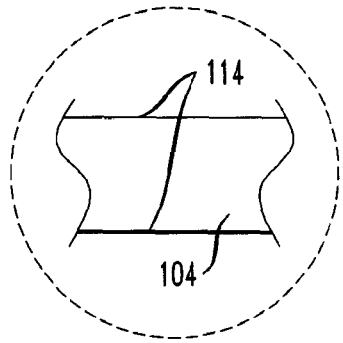

FIG. 2D is a diagram illustrating a top-down view (from vantage point B, see FIG. 2A) of the re-shaped/thinned nanowires and pads. In comparison with the nanowires shown in FIG. 1C, the nanowires shown in FIG. 2D are thinned, i.e., have smaller dimensions, such as a smaller width w (and a smaller thickness t, not visible in the figure). FIG. 2E is a diagram illustrating an enlarged view of one of the re-shaped/thinned nanowires. As shown in FIG. 2E, the $H_2$ anneal smoothes the nanowires sidewalls 114 eliminating the LER problems described above.

Figure 3A:
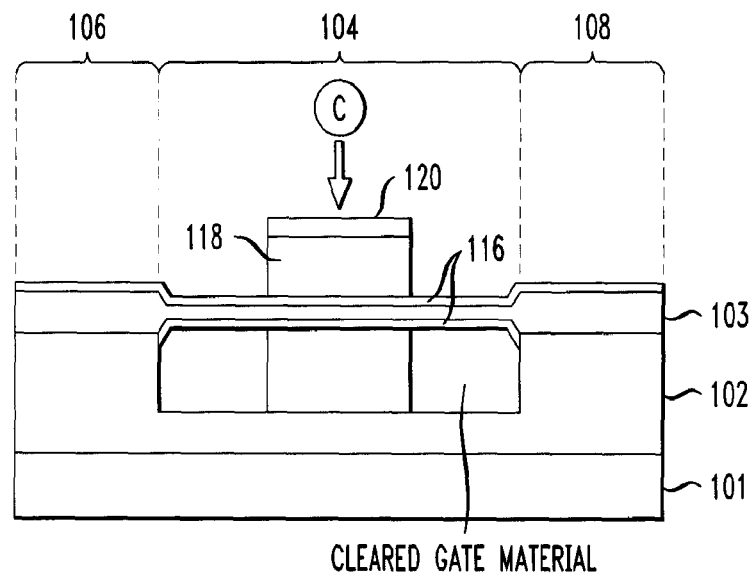
FIGS. 3A and 3B are diagrams illustrating formation of a gate of the FET device according to an embodiment of the present invention.
Figure 3B:
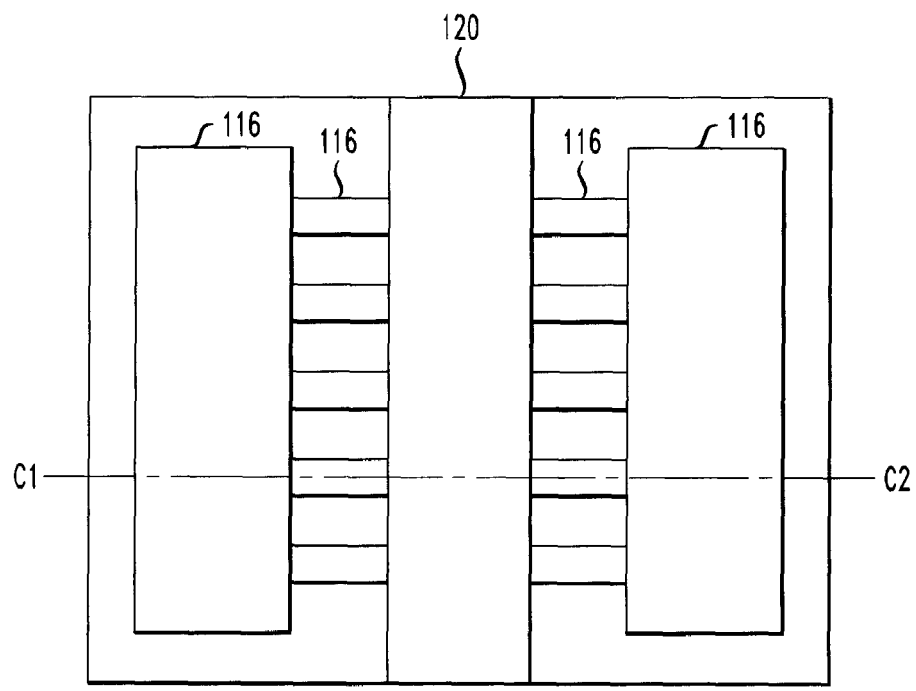

FIGS. 3A and 3B are diagrams illustrating formation of a gate of the device. Referring to FIG. 3A, a cross-sectional diagram, for example through plane C1-C2 (see FIG. 3B, described below), the nanowires 104 and pads 106 and 108 are coated with a gate dielectric 116. The gate dielectric 116 can comprise silicon dioxide ($SiO_2$), silicon oxynitride (SiON), hafnium oxide ($HfO_2$) or any other suitable hi-K dielectric(s) and may be deposited over pads 106/108 and around nanowires 104 using chemical vapor deposition (CVD), atomic layer deposition (ALD) or an oxidation furnace in the case of $SiO_2$ and SiON.

A gate conductor is then blanket deposited over the substrate and patterned by lithography and etching to form gate 118. As an example, to fabricate a poly-Si gate, a poly-Si film is first blanket deposited over the device. Using lithography and selective RIE (e.g., hydrogen bromide (HBr)-based chemistry) the poly-Si film is selectively etched (except from where it is blocked by a hardmask 120) with respect to the gate dielectric 116. The RIE process typically includes two phases. In the first phase, the etching is directional (anisotropic) to obtain a straight profile for the gate line. In the second phase, the etching is rendered isotropic (for example by reducing the RIE bias) and the gate line is trimmed sideways by an amount sufficient to clear the gate material under the nanowires in the regions outside the gate 118 (labeled "cleared gate material"). The devices presented herein are preferably GAA FETs. Thus, as illustrated in FIG. 3A, the gate 118 surrounds the nanowires 104.

FIG. 3B is a diagram illustrating a top-down view (from vantage point C, see FIG. 3A) of the gate dielectric 116 covering SOI pads 106 and 108 and surrounding nanowires 104. Hardmask 120 is shown over gate 118 (the gate is not visible from this perspective as it is hidden by the mask).

Figure 4A:
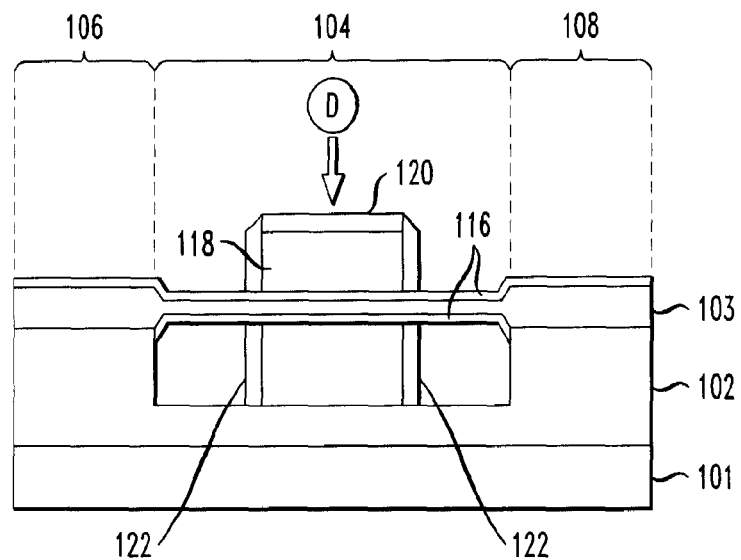
FIGS. 4A and 4B are diagrams illustrating gate spacer formation according to an embodiment of the present invention.
Figure 4B:
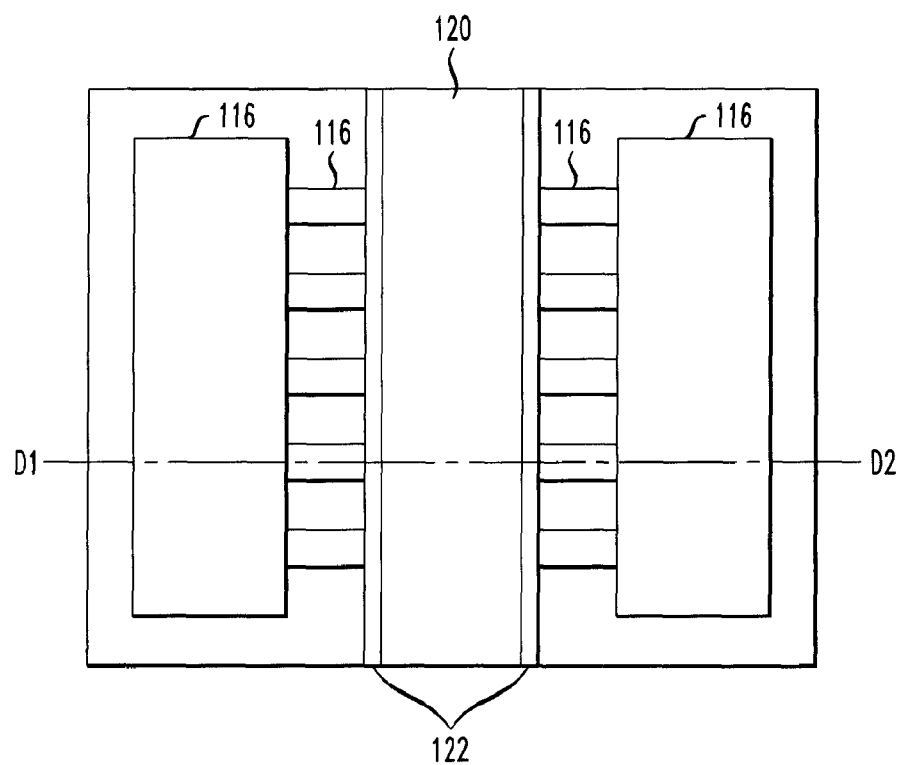

FIGS. 4A and 4B are diagrams illustrating gate spacer formation. Referring to FIG. 4A, a cross-sectional diagram, for example through plane D1-D2 (see, FIG. 4B, described below), spacers 122, which comprise an insulating nitride, oxide, oxynitride or multilayers thereof, are formed adjacent to sidewalls of the gate 118 by deposition and etching. Spacer material may remain under non-gated portions of the nanowires. FIG. 4B is a diagram illustrating a top-down view (from vantage point D, see FIG. 4A) of the spacers 122 formed on opposite sides of gate 118.

Figure 5A:
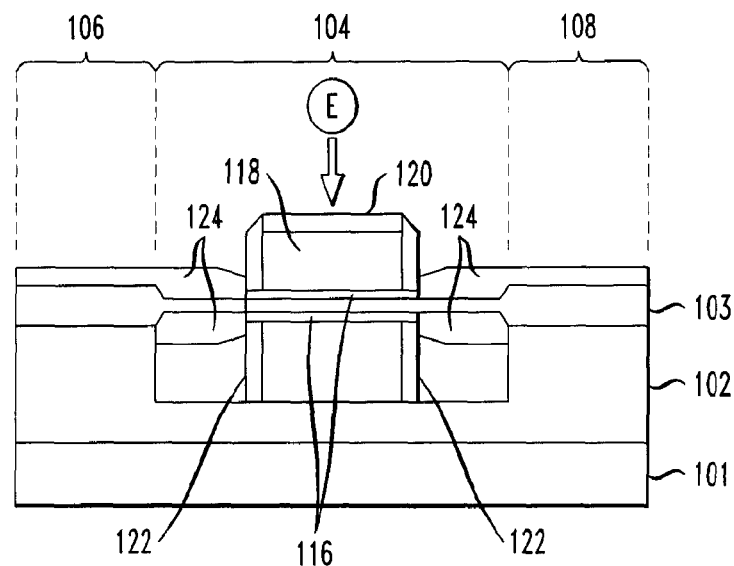
FIGS. 5A and 5B are diagrams illustrating nanowire, source and drain epitaxy according to an embodiment of the present invention.
Figure 5B:
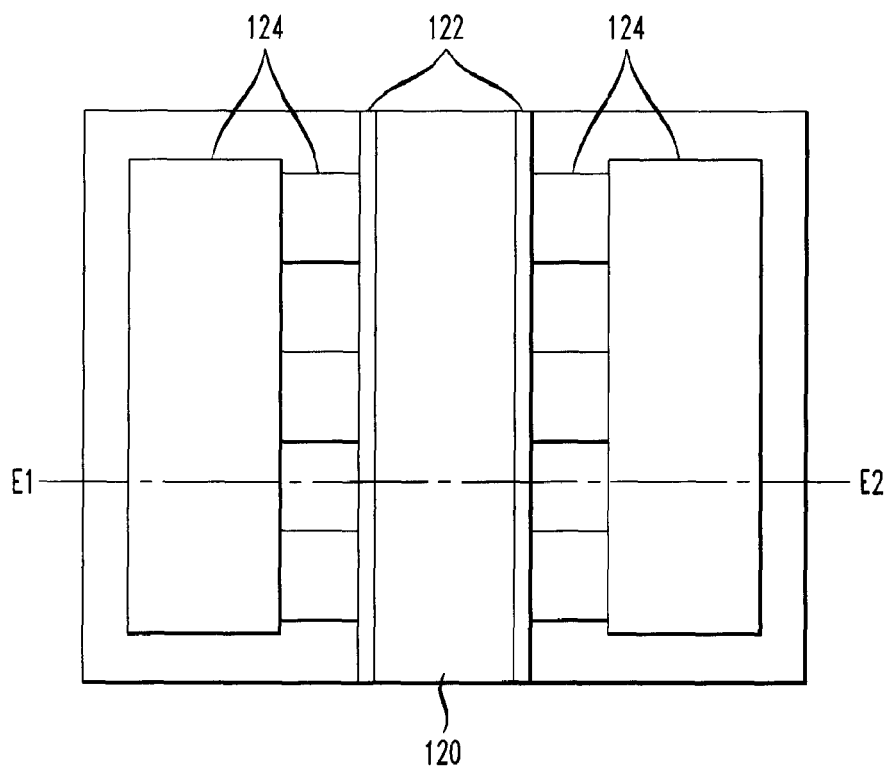

FIGS. 5A and 5B are diagrams illustrating nanowire, source and drain epitaxy. Referring to FIG. 5A, a cross-sectional diagram, for example through plane E1-E2 (see FIG. 5B, described below), the exposed gate dielectric 116 is stripped, and selective epitaxy is used to thicken portions of the nanowires 104 not covered by the gate/spacers and the SOI pads 106 and 108. The epitaxy can merge the nanowires into a continuous block of Si (see FIG. 5B, described below). The resulting epitaxial layer 124 can be of Si or a Si alloy such as SiGe. Growth methods can include ultra-high vacuum chemical vapor deposition (UHV-CVD), rapid thermal chemical vapor deposition (RT-CVD) and ALD. Typical Si precursors include, but are not limited to, dichlorosilane (SiH$_2$Cl$_2$), a mixture of silane (SiH$_4$) and hydrochloric acid (HCl), silicon tetrachloride (SiCl$_4$) and germane (GeH$_4$) for SiGe growth. The growth is selective in the sense that deposition of Si takes place only over Si surfaces, but not over dielectric surfaces such as oxides and silicon-nitrides. While selective Si epitaxy typically requires growth temperatures of about 800° C., maintaining selectivity when using lower growth temperatures is possible by adding Ge to the epitaxial film. With pure Ge growth, the growth temperature can be as low as 300° C. Low temperature growth of SiGe is useful in the case of very thin nanowires as a way to circumvent agglomeration.

Self-aligned ion-implantation is then used to dope the source and drain regions. For n-type doping phosphorus (P) and arsenic (As) are most commonly used, and for p-type doping boron (B), and indium (In) are typical. Rapid thermal annealing (RTA) is used to activate the dopants and anneal out implant damage. At this point in the process, distinct regions of the device become apparent. Namely, the portions of the nanowires 104 surrounded by the gate 118 become a channel region of the device, and the SOI pads 106 and 108 and the exposed and, e.g., merged by epitaxy, portions of the nanowires extending out from the gate adjacent to the pads become source and drain regions of the device.

FIG. 5B is a diagram illustrating a top-down view (from vantage point E, see FIG. 5A) of the epitaxial layer 124 covering the source and drain regions of the device. As shown in FIG. 5B, the epitaxy can merge the nanowires into a continuous block of Si.

Figure 6A:
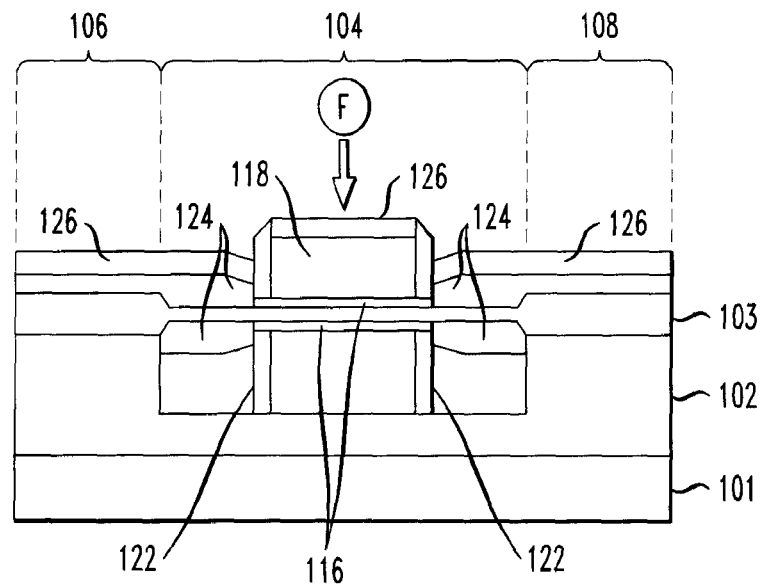
FIGS. 6A and 6B are diagrams illustrating formation of a self-aligned silicide according to an embodiment of the present invention.
Figure 6B:
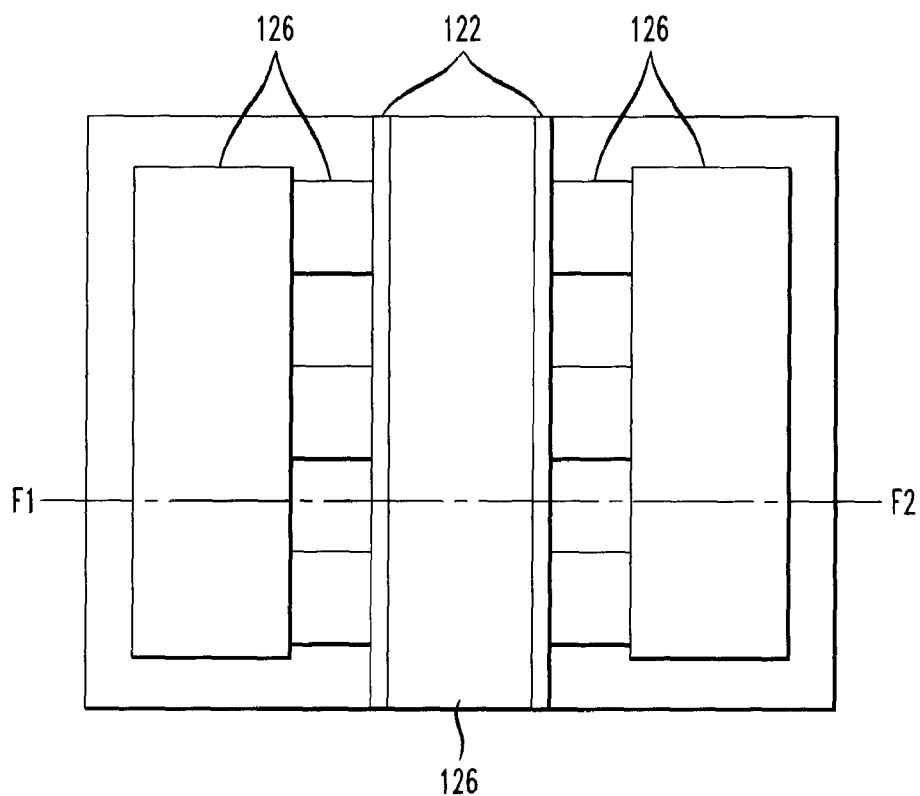

FIGS. 6A and 6B are diagrams illustrating formation of a self-aligned silicide. Referring to FIG. 6A, a cross-sectional diagram, for example through plane F1-F2 (see, FIG. 6B, described below), a self-aligned silicide 126 is formed over the source and drain regions (and the gate if a poly-Si gate is used). More specifically, a metal such as nickel (Ni), platinum (Pt), cobalt (Co) and/or titanium (Ti) is blanket deposited over the device. The assembly is annealed to allow the metal to react with the exposed Si over the source, drain and gate regions. The metal over non-Si surfaces (e.g., the metal over spacers 122) remains unreacted. A selective etch is then used to remove the unreacted metal, leaving silicide 126 over the source, drain and gate surfaces. As an example, in the case where Ni is used, the lower resistivity silicide phase is nickel-silicon (NiSi). The NiSi phase forms at an annealing temperature of about 420° C., and the etch chemistry used to remove the unreacted metal is hydrogen peroxide:sulfuric acid (H$_2$O$_2$:H$_2$SO$_4$) 10:1 at 65° C. for 10 minutes.

FIG. 6B is a diagram illustrating a top-down view (from vantage point F, see FIG. 6A) of the self-aligned silicide 126 over the source, drain and gate regions of the device. As shown in FIG. 6B, the unreacted metal has been removed from the spacers 122, as described above.

Experimental examples of the use of H$_2$ annealing as a tool for reshaping nanowires are now presented. FIGS. 7A-F are scanning electron micrograph (SEM) images illustrating the effects of H$_2$ annealing on a Si bar. In this example, a Si bar was used to simulate the effects H$_2$ annealing would have on a nanowire. Referring to FIG. 7A, a side view SEM image, and FIG. 7B, a top-down view SEM image of a Si bar that was fabricated by patterning a SOI film (of a wafer with the SOI layer over a BOX layer), the as-etched Si bar has a rectangular cross-section and shows pronounced LER induced by photoresist trim. See also, FIG. 7C, an enlarged view of the as-etched Si bar. The SOI film was etched in DHF to strip the native oxide from the Si bar. The etching also led to a slight recessing of the BOX layer not masked by the Si bar. Due to the etching being isotropic a slight undercutting of the BOX layer under the Si bar was also obtained. The wafer was then annealed in H$_2$. The annealing temperature was 1000° C., the H$_2$ pressure was 600 torr, and the anneal duration was five minutes. The temperature ramping-up rate was 50° C./second. FIG. 7D is a side view SEM image, and FIG. 7E is a top-down view SEM image of the Si bar after the annealing. Both images clearly show that the LER is substantially reduced resulting in a much smoother line edge. See also, FIG. 7F, an enlarged view of the Si bar after the annealing. Additionally the as-etched rectangular Si bar cross-section was re-shaped into a circular cross-section.

The rate of Si migration strongly depends on a curvature of the surface. A smaller radius leads to faster Si diffusion. For example, the corners of the rectangular bar have a very small radius of curvature. As a result, the H$_2$ annealing leads to rounding of the corners (larger radius). Longer annealing time can transform the cross section to be circular (forming a cylinder having even a larger radius of curvature as compared with the original 90 degree corners). This is why the H$_2$ annealing process is effective in reducing LER. When the Si structures are small (e.g., nanowires), lower annealing temperatures can provide better process control.

Figure 8A:
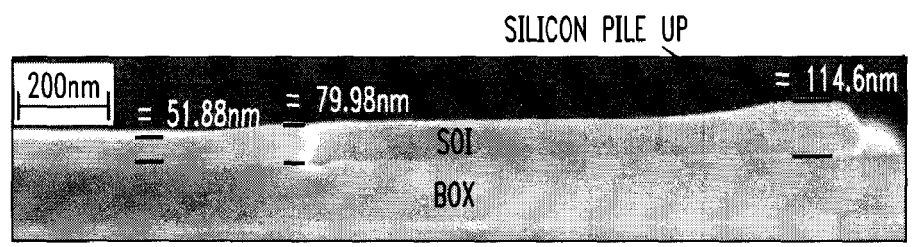
FIGS. 8A and 8B are SEM images illustrating the effects of H₂ annealing on a silicon-on-insulator (SOI) slab according to an embodiment of the present invention.
Figure 8B:
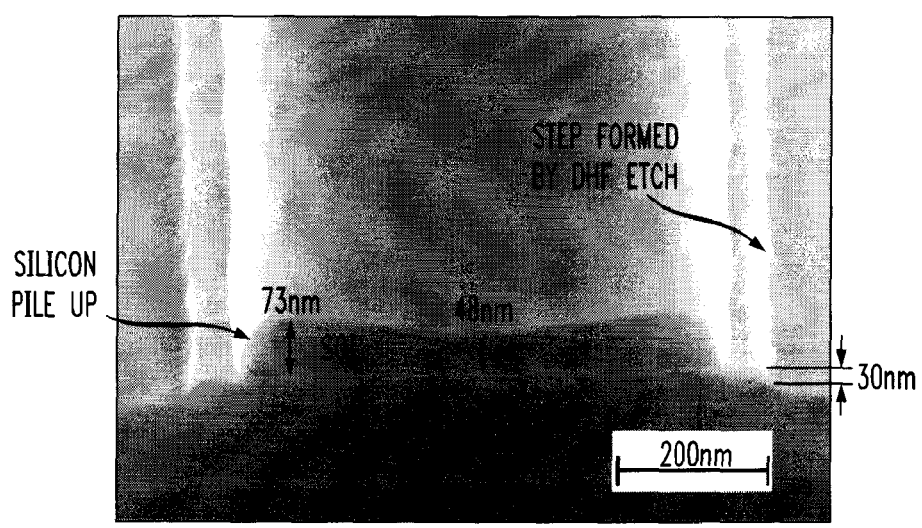

FIGS. 8A and 8B are SEM images illustrating the effects of H$_2$ annealing on a SOI slab. Referring to FIG. 8A, a cross-sectional view SEM image, and FIG. 8B, a side view SEM image of 50 nm thick SOI slabs that were annealed in H$_2$. The annealing temperature was 1000° C., the H$_2$ pressure was 600 torr and the anneal duration was 20 minutes. The wafer was etched in 10:1 DHF for 60 seconds prior to H$_2$ annealing. The etching led to a step in the BOX (about 30 nm tall) that marked approximately the edge of the as-etched Si slab. During H$_2$ annealing, Si from the slab edge pulls back from the edge leaving a strip of a bare oxide mesa behind. The Si pile-up at the newly formed edge of the slab brings the total SOI thickness there to 73 nm as compared with only 48 nm at the center of the slab.

Figure 9A:
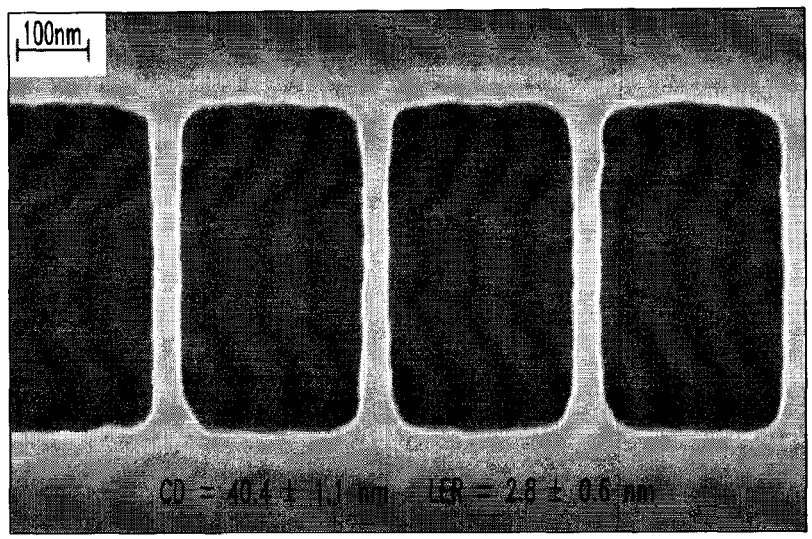
FIGS. 9A-D are SEM images illustrating H₂ annealing being used to re-shape Si nanowires according to an embodiment of the present invention.
Figure 9B:
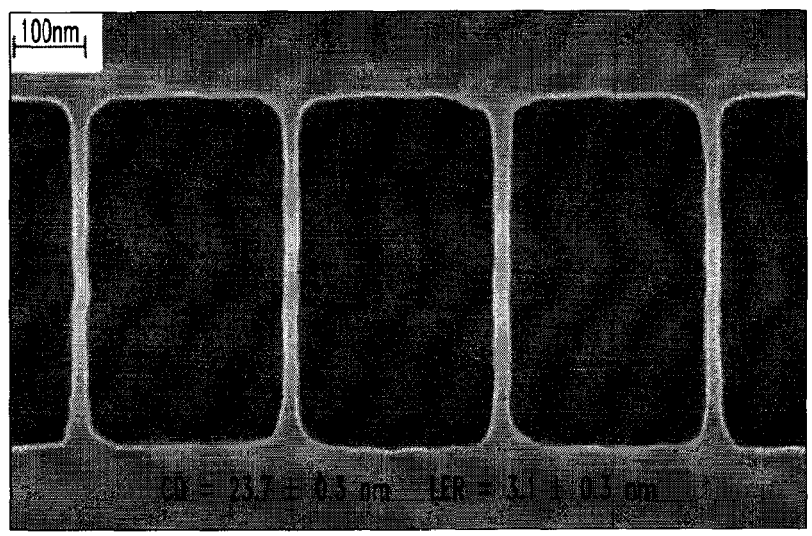
Figure 9C:
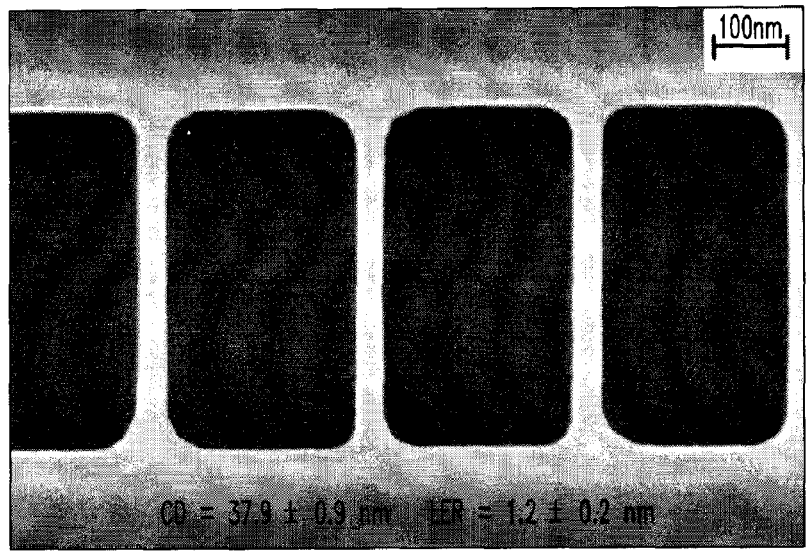
Figure 9D:
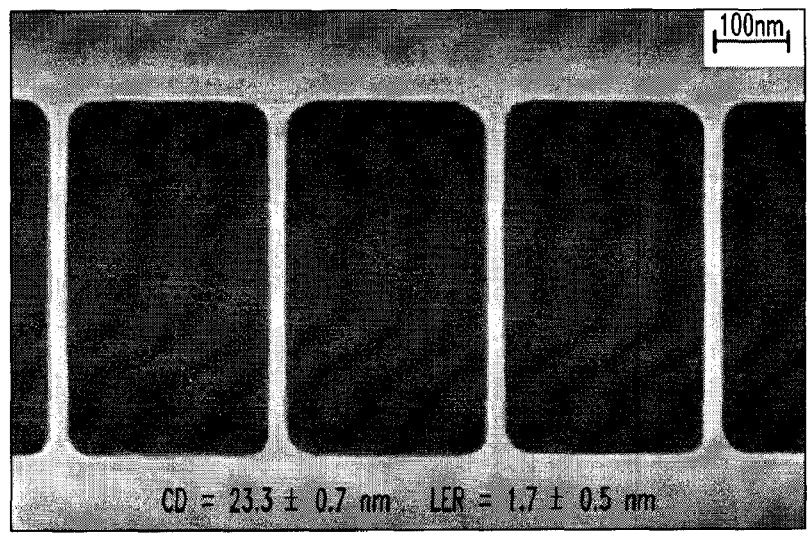

FIGS. 9A-D are SEM images illustrating H$_2$ annealing being used to re-shape Si nanowires. FIG. 9A is an SEM image of as-etched nanowires with a critical dimension (CD) of 40.4±1.1 nm and LER of 2.8±0.6 nm and FIG. 9B is an SEM image of as-etched nanowires with a width of 23.7±0.3 nm and LER of 3.1±0.3 nm. CD is a well known term of art that refers to a smallest dimension in an electronic device. With nanowire-based devices, as is the case here, the term CD refers to a nanowire width. LER is measured by first taking the SEM image and then post processing the image with software that performs a spatial spectrum analysis of the line edge. The results of a H$_2$ anneal on the samples from FIG. 9A and FIG. 9B are shown in FIG. 9C and FIG. 9D, respectively. Specifically, following annealing in H$_2$ (temperature was 825° C., H$_2$ pressure was 600 torr and the anneal duration was five minutes), the LER was reduced for the sample shown in FIG. 9A to 1.2±0.2 nm and for the sample shown in FIG. 9B to 1.7+0.5 nm (see FIGS. 9C and 9D, respectively). Note that straight and smooth edges are also obtained at the edge of the SOI pads to which the nanowires are attached.

In the legends accompanying each of the images, CD, line width roughness (LWR), LWR', LER and LER' values are presented. CD is the nanowire width, as highlighted above. LWR' and LER' represent LWR and LER values, respectively, corrected for noise due to the image being digitized (i.e., having a finite number of pixels).

Figure 10A:
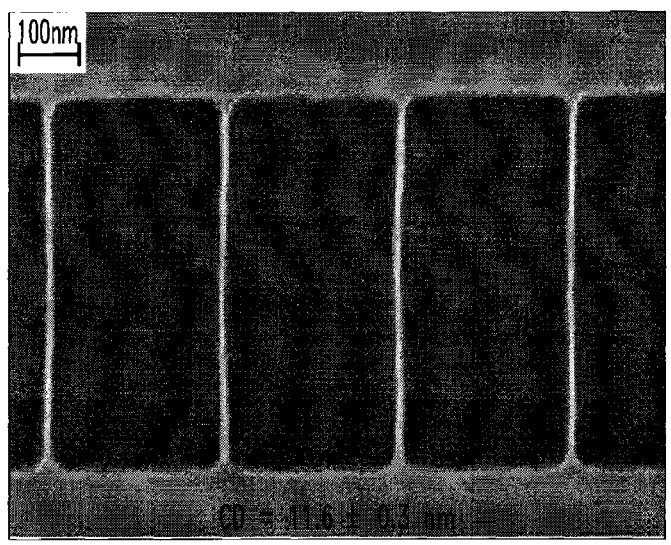
FIGS. 10A-H are SEM images illustrating another example of H₂ annealing being used to re-shape Si nanowires according to an embodiment of the present invention.
Figure 10B:
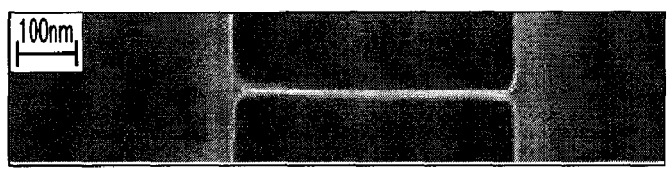
Figure 10C:
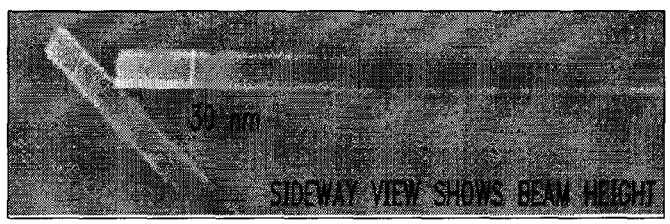
Figure 10D:
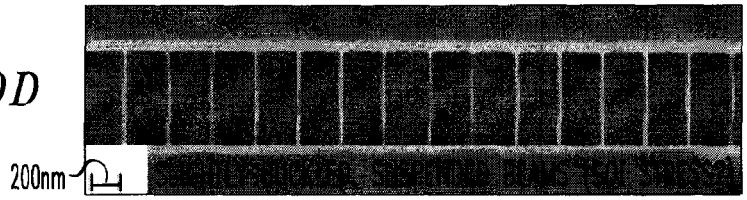
Figure 10E:
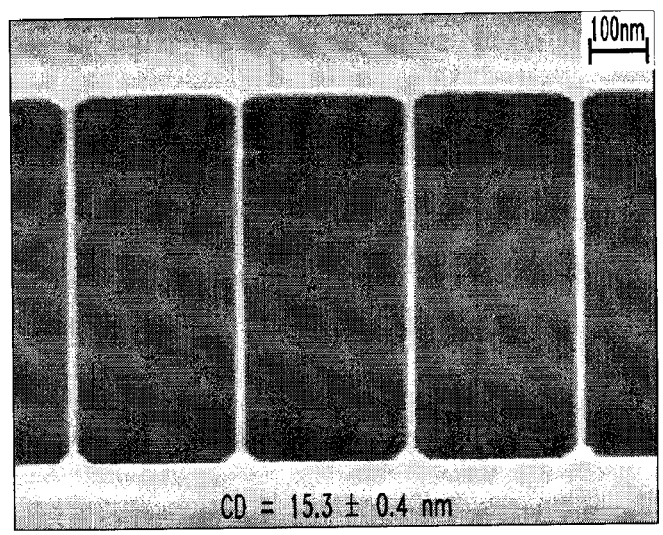

FIGS. 10A-H are SEM images illustrating another example of H$_2$ annealing being used to re-shape Si nanowires. FIG. 10A is a top-down SEM image showing as-etched nanowires (in SOI) with a rectangular cross-section. The nanowire width, which is defined by lithography, is 11.6 nm. FIG. 10B is a top-down SEM image showing as-etched nanowires with a width of seven nm. The sample shown in FIG. 10B was included to demonstrate that the present process works with sub-10 nm nanowires. As can be seen in FIG. 10C, a sideway view SEM image of individual nanowires, the height of the nanowires (which is defined by the SOI thickness) is 30 nm. The nanowires were suspended by etching in DHF. As highlighted above, the etching releases the nanowires by undercutting a BOX layer beneath the SOI. As can be seen in FIG. 10D, top-down view SEM image that encompasses more of the nanowires, residual stress in the SOI wafer can cause some buckling in the suspended nanowires.

Figure 10F:
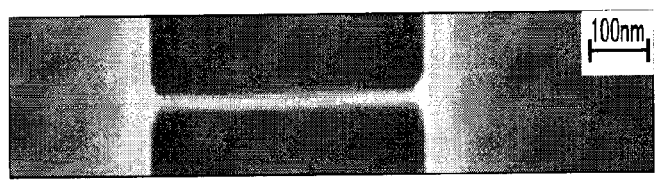
Figure 10G:
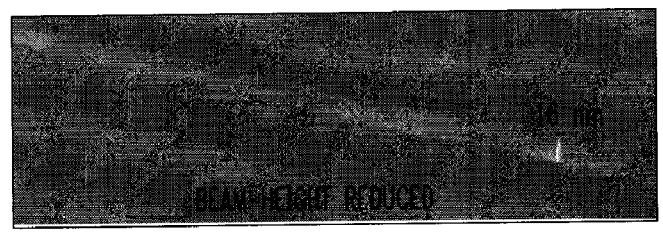
Figure 10H:
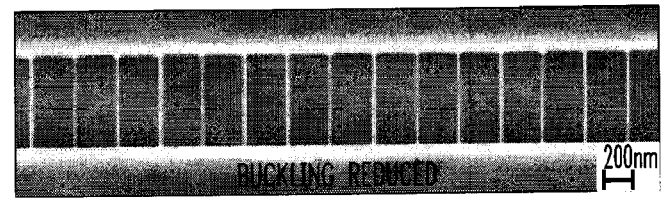

The results of a $H_2$ anneal on the sample are shown in the SEM images of FIGS. 10E-H, with the same views from FIGS. 10A-D being presented in FIGS. 10E-H, respectively. Following the $H_2$ anneal (temperature was 825° C., $H_2$ pressure was 600 torr and the anneal duration was five minutes), the nanowires appear more straight and more smooth, i.e., when one compares FIGS. 10A-D with FIGS. 10E-H, respectively. Further, a measured width (i.e., CD) of each nanowire is 15.3±0.4 nm, which is larger than the corresponding as-etched width of 11.6±0.3 nm (see FIG. 10A). The reason for this dimensional change is the re-distribution of Si, which led to a re-shaped nanowire cross-section that approximates a circle. The nanowire height was reduced from 30 nm to 16 nm (see FIGS. 10C and 10G, respectively). The cross-sectional area of the post $H_2$ anneal nanowires is smaller ($A_{post\ hydrogen\ anneal}=\pi\times(16/2)^2=201$ nm$^2$ vs. $A_{as-etched}=11.6\times30=348$ nm$^2$) which illustrates that the nanowires are also thinned by the $H_2$ annealing as Si migrates from the nanowire body to the attached Si SOI pads. Si migration is faster with smaller nanowire dimensions making them more prone to agglomeration. Yet as FIG. 10F shows, the process can be used even with nanowires having an as-etched sub-10 nm width (FIG. 10B).

Figure 11:
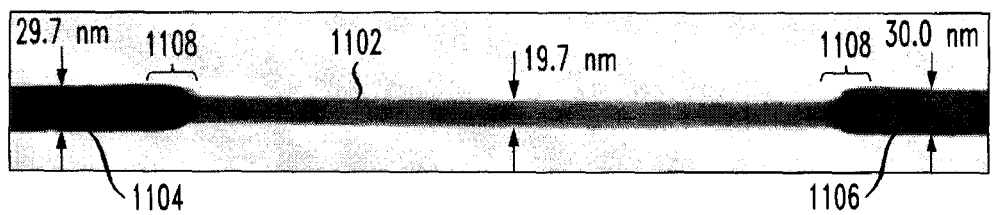
FIG. 11 is a transmission electron microscope (TEM) image of a cross-section along a nanowire through two SOI pads that are connected by the nanowire after H₂ annealing according to an embodiment of the present invention.

FIG. 11 is a transmission electron microscope (TEM) image of a cross-section along a nanowire 1102 through two SOI pads 1104 and 1106 that are connected by nanowire 1102 after $H_2$ annealing. An original (pre-anneal) thickness of SOI pads 1104 and 1106 was about 30 nm. An original height of nanowire 1102 was also 30 nm since the height was defined by etching an SOI film by RIE. After $H_2$ annealing, the SOI pads thicknesses remained constant, while the height of the nanowire was reduced to 19.7 nm. The reduction in the height of the nanowire without changing the thickness of the SOI pads clearly demonstrates a mask-less selective thinning of nanowires. Also, the pile-up of Si 1108 at edges of the SOI pads provides evidence of the migration of Si from the nanowire body to the SOI. Additionally, the thinning takes place from both top and bottom surfaces of the nanowire. The thinning from the bottom nanowire surface shows how this process would lead to suspension of the nanowire from the BOX.

Figure 12:
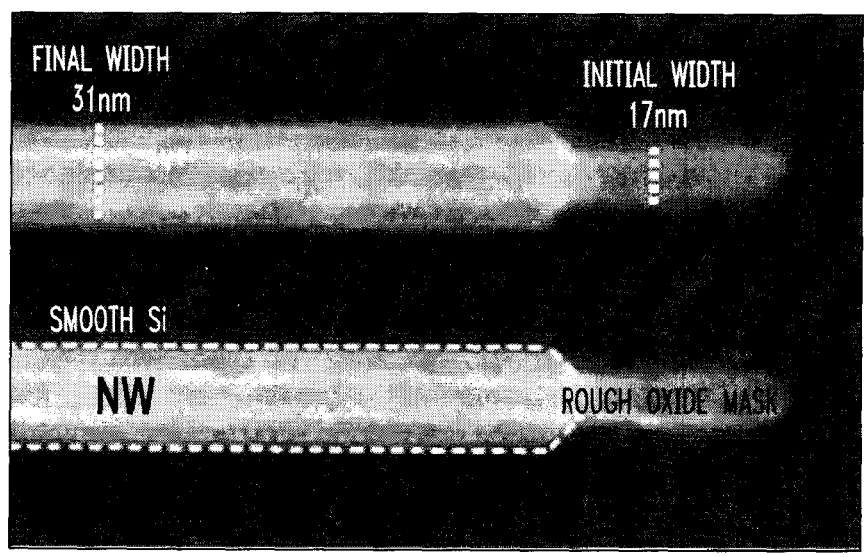
FIG. 12 is a top-down SEM image of nanowires not attached to SOI pads according to an embodiment of the present invention.

FIG. 12 is a top-down SEM image of nanowires (labeled NW) not attached to SOI pads. The image shows the original oxide mask used to define the nanowire as well as the nanowire after $H_2$ annealing. It is notable that the oxide mask edges are rough while the nanowire edges are smoother and faceted by the $H_2$ annealing. The nanowire is pulled from the edge of the mask and agglomerate into a wider nanowire. This process leads to wider nanowires.

Figure 13A:
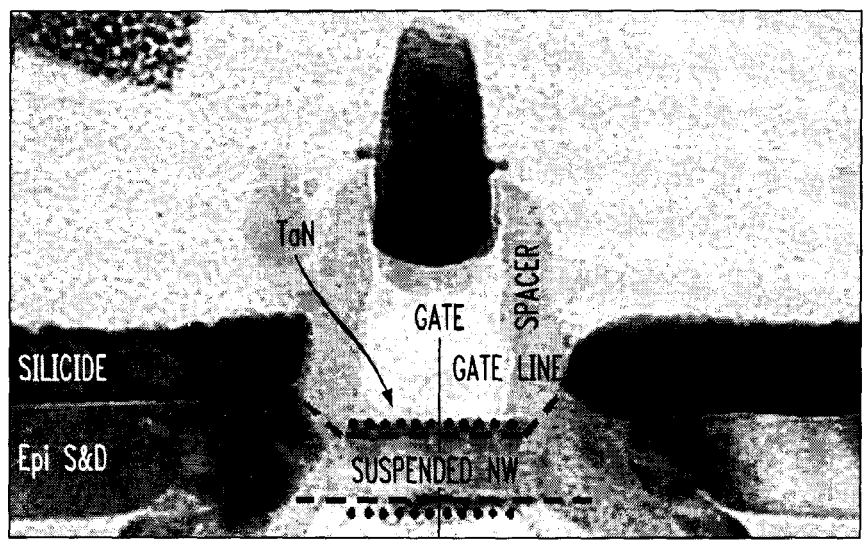
FIGS. 13A and 13B are TEM images taken through a fabricated device according to an embodiment of the present invention.
Figure 13B:
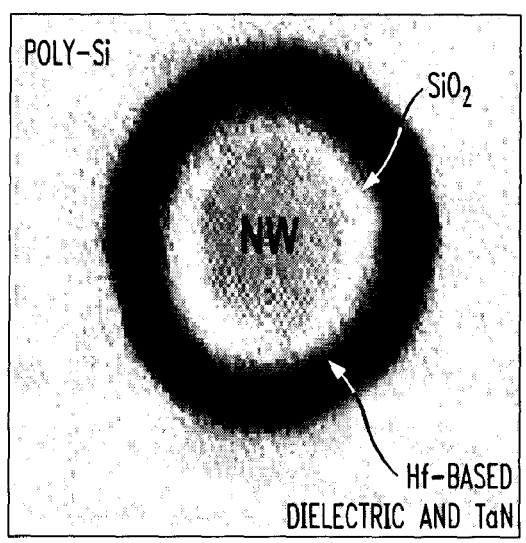

FIGS. 13A and 13B are TEM images taken through a fabricated device. Specifically, the image in FIG. 13A shows a cross-section along a nanowire from source to drain (S&D). The gate dielectric used in this particular example is hafnium silicate (HfSi$_x$O$_x$) and the gate was tantalum nitride (TaN) capped with poly-Si. The image in FIG. 13B shows a cross-section through a nanowire (NW) along the gate line. It is notable that that the nanowire body thickness (channel region) is thinner than the SOI in the source and drain regions. This is a result of mask-less thinning by $H_2$ annealing followed by oxidation, and the additional thickening of the source and drain regions by Si epitaxy (Epi).

Figure 14:
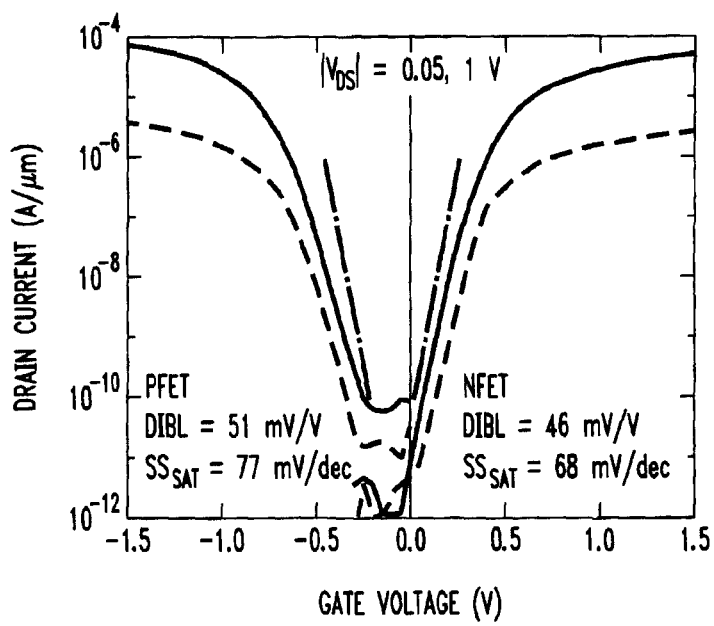
FIG. 14 is a graph illustrating measured current-voltage ($I_d$-$V_g$) characteristics for nanowire-based gate-all-around (GAA) n-channel field effect transistor (NFET) and p-channel field effect transistor (PFET) devices fabricated using the present techniques according to an embodiment of the present invention.

FIG. 14 is a graph 1400 illustrating measured drain current-gate voltage ($I_d$-$V_g$) characteristics for nanowire-based GAA n-channel field effect transistor (NFET) and p-channel field effect transistor (PFET) devices fabricated using the present nanowire thinning/re-shaping techniques. For each device, two $I_d$-$V_g$ curves were taken with source drain bias ($V_{DS}$) equal to 0.05 volts (V) and 1.0V. In graph 1400, gate voltage (measured in V) is plotted on the x-axis and drain current (measured in amps per micrometer (A/μm) is plotted on the y-axis. The PFET device curves are shown in the left half of graph 1400 and the NFET device curves are shown in the right half of graph 1400. For the PFET device, drain induced barrier lowering (DIBL) was 51 millivolts per volt (mV/V) and the sub-threshold slope (SSsat) was 77 millivolts per decade (dec). For the NFET device, DIBL was 46 mV/V and the SSsat was 68 millivolts per decade. The near ideal (60 mV/decade) SSsat suggests that the Si nanowire-gate dielectric interface has a low density of interface traps, confirming the high quality nanowires sidewall surfaces obtained by this process.

Figure 15:
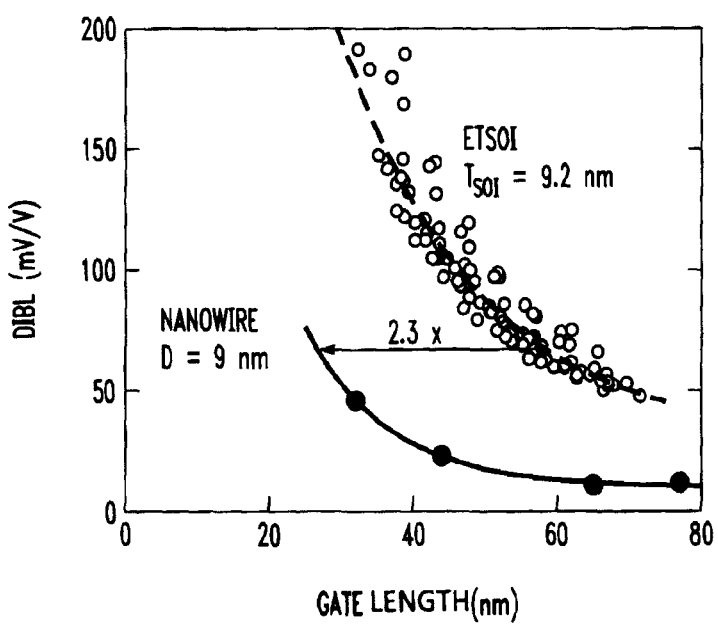
FIG. 15 is a graph illustrating drain induced barrier lowering (DIBL) as a function of device gate length for a nanowire-based GAA device fabricated using the present techniques according to an embodiment of the present invention.

FIG. 15 is a graph 1500 illustrating drain induced barrier lowering (DIBL) as a function of device gate length for a nanowire-based GAA device fabricated using the present nanowire thinning/re-shaping techniques. The nanowire channel diameter was about nine nm. Also shown as a reference is the DIBL data taken for a planar single-gate SOI metal-oxide semiconductor field-effect transistor (MOSFET) with an extremely thin SOI (ETSOI) channel thickness ($T_{SOI}$) of 9.2 nm. In graph 1500, gate length (measured in nm) is plotted on the x-axis and DIBL (measured in mV/V) is plotted on the y-axis. As can be seen the GAA nanowire device exhibited a substantially lower DIBL for similar gate lengths, making it suitable for future scaling of Si technology.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A device comprising:
    a first pad;
    a second pad;
    a plurality of nanowires connecting the first pad and the second pad in a ladder-like configuration formed in a silicon-on-insulator (SOI) layer over a buried oxide (BOX) layer, the nanowires having one or more dimensions defined by a re-distribution of silicon from the nanowires to the pads;
    a gate surrounding the nanowires;
    a dielectric between the gate and the nanowires; and
    spacers adjacent to the gate,
    wherein the device comprises a field-effect transistor (FET) where portions of the nanowires surrounded by the gate form channels of the FET, the first pad and portions of the nanowires extending out from the gate adjacent to the first pad form a source region of the FET and the second pad and portions of the nanowires extending out from the gate adjacent to the second pad form a drain region of the FET.

2. The device of claim 1, wherein the nanowires have one or more of a width and a height defined by the re-distribution of silicon from the nanowires to the pads.

3. The device of claim 1, wherein the nanowires are at least partially released from the BOX layer.

4. The device of claim 1, wherein the nanowires have a shape defined by the re-distribution of silicon from the nanowires to the pads.

5. The device of claim 1, wherein the nanowires have a thickness that is less than a thickness of the pads.

6. The device of claim 1, further comprising an epitaxial layer covering the source and drain regions.

7. The device of claim 6, wherein the epitaxial layer merges the portions of the nanowires extending out from the gate adjacent to the pads into a continuous block of silicon.

8. The device of claim 1, further comprising a pile-up of silicon on the pads at junctures with one or more of the nanowires.

\* \* \* \* \*